(12) United States Patent
Takahashi et al.

(10) Patent No.: US 11,758,744 B2
(45) Date of Patent: Sep. 12, 2023

(54) ORGANIC DEVICE HAVING A FIRST CONDUCTIVE MEMBER ELECTRICALLY CONNECTING A FIRST ELECTRODE AND A SECOND CONDUCTIVE MEMBER ELECTRICALLY CONNECTING A SECOND ELECTRODE, DISPLAY DEVICE, PHOTOELECTRIC CONVERSION DEVICE, ELECTRONIC DEVICE, ILLUMINATION DEVICE, MOBILE DEVICE LIGHTING APPLIANCE, AND MOBILE DEVICE HAVING THE SAME

(71) Applicant: CANON KABUSHIKI KAISHA, Tokyo (JP)

(72) Inventors: Tetsuo Takahashi, Kanagawa (JP); Norifumi Kajimoto, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 202 days.

(21) Appl. No.: 17/358,210

(22) Filed: Jun. 25, 2021

(65) Prior Publication Data

US 2022/0013583 A1 Jan. 13, 2022

(30) Foreign Application Priority Data

Jul. 10, 2020 (JP) .................................. 2020-119448

(51) Int. Cl.
*H01L 29/08* (2006.01)
*H10K 39/32* (2023.01)
(Continued)

(52) U.S. Cl.
CPC .............. *H10K 39/32* (2023.02); *H10K 30/81* (2023.02); *H10K 50/824* (2023.02); *H10K 59/124* (2023.02); *H10K 59/123* (2023.02)

(58) Field of Classification Search
CPC ...... H10K 39/32; H10K 30/81; H10K 50/824; H10K 59/124; H10K 59/123
(Continued)

(56) References Cited

U.S. PATENT DOCUMENTS

| 10,665,812 B2 | 5/2020 | Ajiki et al. | |
| 2014/0204259 A1* | 7/2014 | Mitsui | B82Y 10/00 |
| | | | 348/311 |

(Continued)

FOREIGN PATENT DOCUMENTS

JP 2018-129265 A 8/2018

*Primary Examiner* — Phuc T Dang
(74) *Attorney, Agent, or Firm* — VENABLE LLP

(57) ABSTRACT

An organic device comprising first and second conductive line, an insulator arranged above the first and second conductive lines, a first electrode arranged above the insulator, an organic layer arranged above the first electrode, a second electrode arranged above the organic layer, a first via including a first conductor connecting the first conductive line and the first electrode, and a second via including a second conductor connecting the second conductive line and the second electrode, is provided. An upper portion of the first via is filled with the first conductor. An upper portion of the second via includes a region which is not filled with the second conductor and covered by the second conductor. An inner wall of the second conductor along the second via includes a region without the organic layer in contact with the second electrode.

18 Claims, 14 Drawing Sheets

(51) Int. Cl.
  *H10K 30/81*   (2023.01)
  *H10K 50/824*  (2023.01)
  *H10K 59/124*  (2023.01)
  *H10K 59/123*  (2023.01)
(58) Field of Classification Search
  USPC .......................................................... 257/40
  See application file for complete search history.

(56) References Cited

U.S. PATENT DOCUMENTS

2018/0108724 A1* 4/2018 Lee ...................... H01L 27/1218
2020/0350506 A1* 11/2020 Cho ...................... H10K 59/124

* cited by examiner

ORGANIC DEVICE HAVING A FIRST CONDUCTIVE MEMBER ELECTRICALLY CONNECTING A FIRST ELECTRODE AND A SECOND CONDUCTIVE MEMBER ELECTRICALLY CONNECTING A SECOND ELECTRODE, DISPLAY DEVICE, PHOTOELECTRIC CONVERSION DEVICE, ELECTRONIC DEVICE, ILLUMINATION DEVICE, MOBILE DEVICE LIGHTING APPLIANCE, AND MOBILE DEVICE HAVING THE SAME

BACKGROUND OF THE INVENTION

Field of the Invention

The present invention relates to an organic device, a display device, a photoelectric conversion device, an electronic device, an illumination device, a mobile device lighting appliance, and a mobile device.

Description of the Related Art

An organic device that includes a photoelectric conversion element or a light emitting element which includes an organic layer for emitting light or performing photoelectric conversion has gained attention. In an organic device, an organic layer or an upper electrode may be integrally formed on the entire surface of a light emitting region or a photoelectric conversion region. If a power supply unit for the upper electrode is arranged outside the light emitting region or the photoelectric conversion region on which the organic layer is arranged, a region without the organic layer will increase, thus increasing the size of the organic device. If the size of the organic device increases, the number of organic devices that can be obtained from a single substrate will decrease, thereby increasing the cost per organic device. Japanese Patent Laid-Open No. 2018-129265 discloses that an auxiliary electrode layer that connects to a common electrode layer (upper electrode) will be arranged in a portion where the organic layer is to be arranged.

In Japanese Patent Laid-Open No. 2018-129265 discloses that a pixel electrode layer (lower electrode) and a conductive line are connected at the bottom of a connection concave portion which is formed by recessing a part of the pixel electrode layer in a contact hole arranged in an interlayer insulating layer. A concave shape corresponding to the shape of the connection concave portion may be formed on the upper surface of a bank on the connection concave portion. If a concave shape is formed on the upper surface of the bank, a portion of the organic layer which is arranged on the concave shape of the bank may become thin due to the concave shape of the bank. If the organic layer becomes thin, it may increase a leak current between the upper electrode and a lower electrode.

SUMMARY OF THE INVENTION

Some embodiments of the present invention provide a technique advantageous in suppressing the cost of manufacturing an organic device and in suppressing a leak current.

According to some embodiments, an organic device comprising a substrate, a first conductive line and a second conductive line arranged above a main surface of the substrate, an interlayer insulating layer arranged above the first conductive line and the second conductive line, a first electrode arranged above the interlayer insulating layer, an organic layer arranged above the first electrode, and a second electrode arranged above the organic layer, wherein in a region, of the interlayer insulating layer, where the organic layer is arranged in an orthogonal projection with respect to the main surface, a first via hole, in which a first conductive member configured to electrically connect the first conductive line and the first electrode is arranged, and a second via hole, in which a second conductive member configured to electrically connect the second conductive line and the second electrode is arranged, are arranged, at least an upper portion of the first via hole is filled with the first conductive member, at least an upper portion of the second via hole includes a region which is not filled with the second conductive member, a side surface of the second via hole is covered by the second conductive member in the region which is not filled with the second conductive member in the second via hole, an inner wall, of the second conductive member, along the side surface of the second via hole includes a region without the organic layer, and the second electrode is in contact with the region without the organic layer in the inner wall, of the second conductive member, along the side surface of the second via hole, is provided.

Further features of the present invention will become apparent from the following description of exemplary embodiments (with reference to the attached drawings).

DESCRIPTION OF THE EMBODIMENTS

Figure 1:
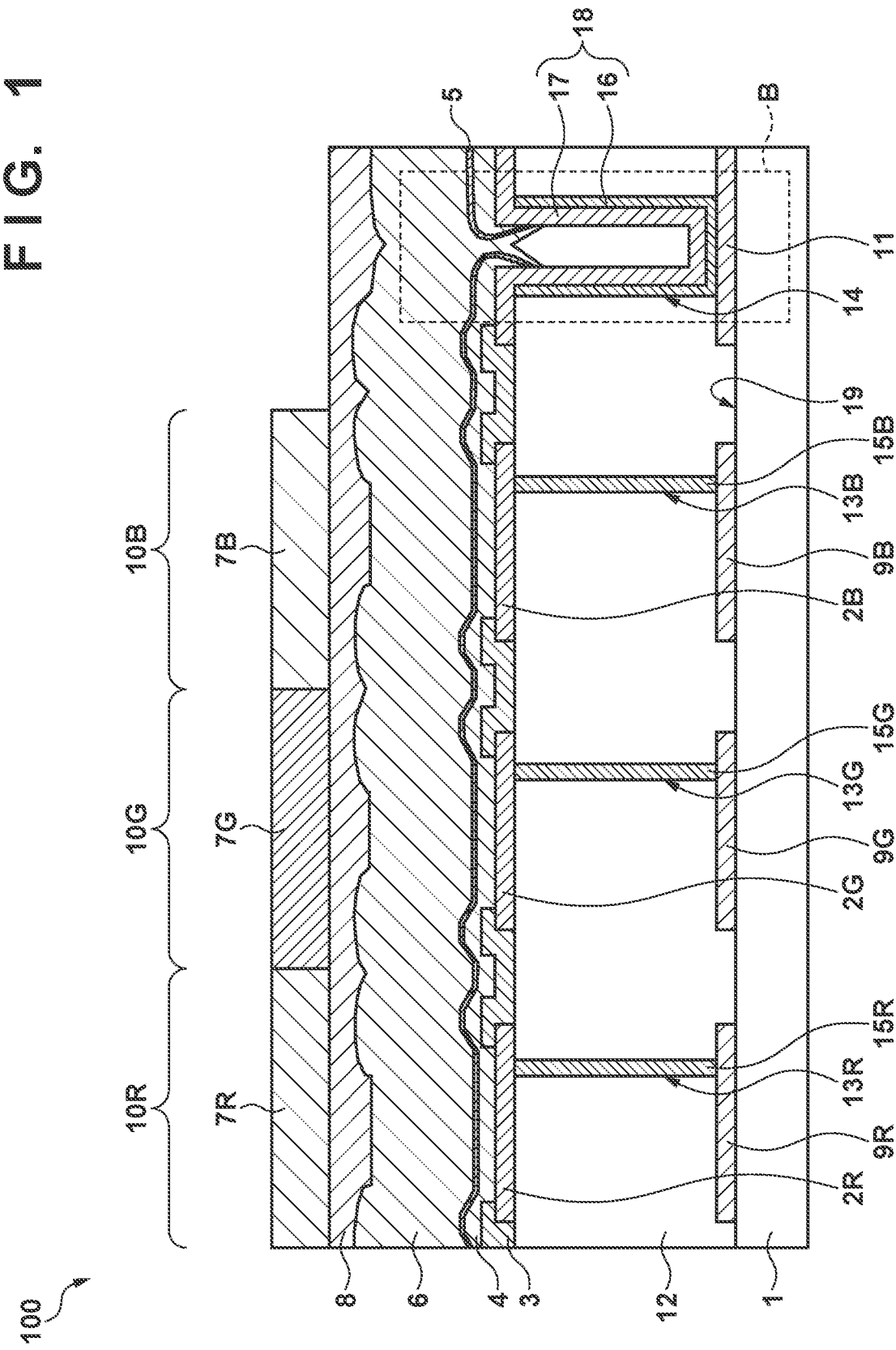
FIG. 1 is a sectional view showing an example of the arrangement of an organic device according to an embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

Figure 2:
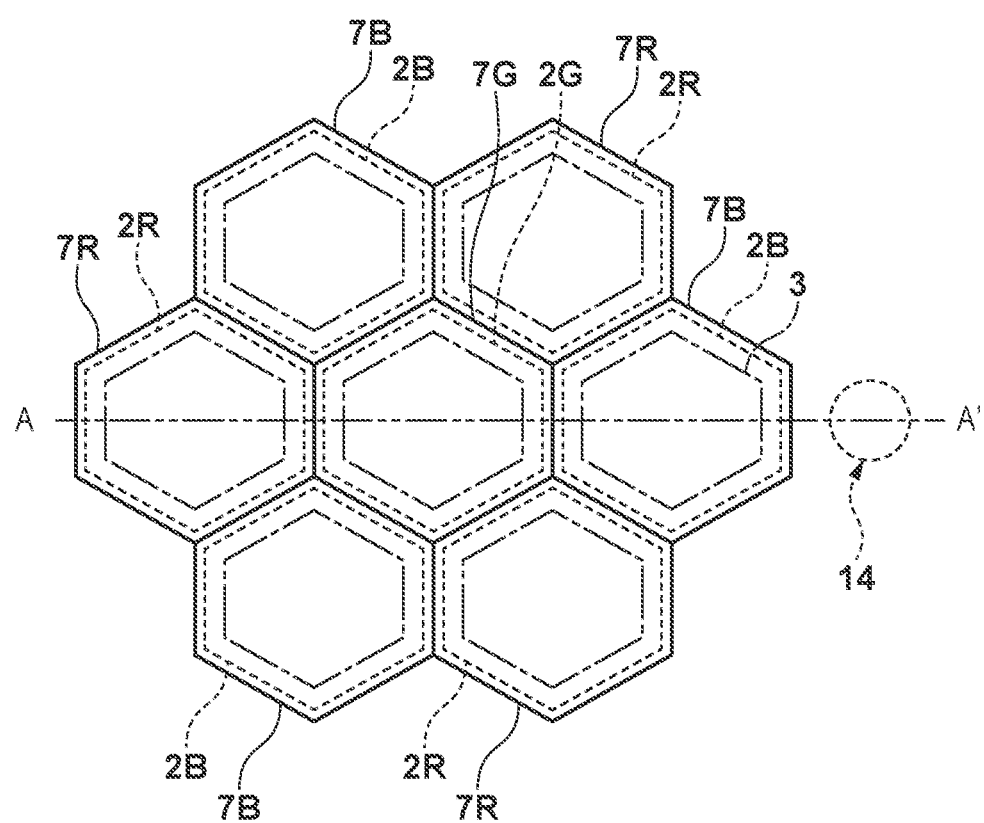
FIG. 2 is a plan view showing an example of the arrangement of the organic device of FIG. 1.
Figure 3:
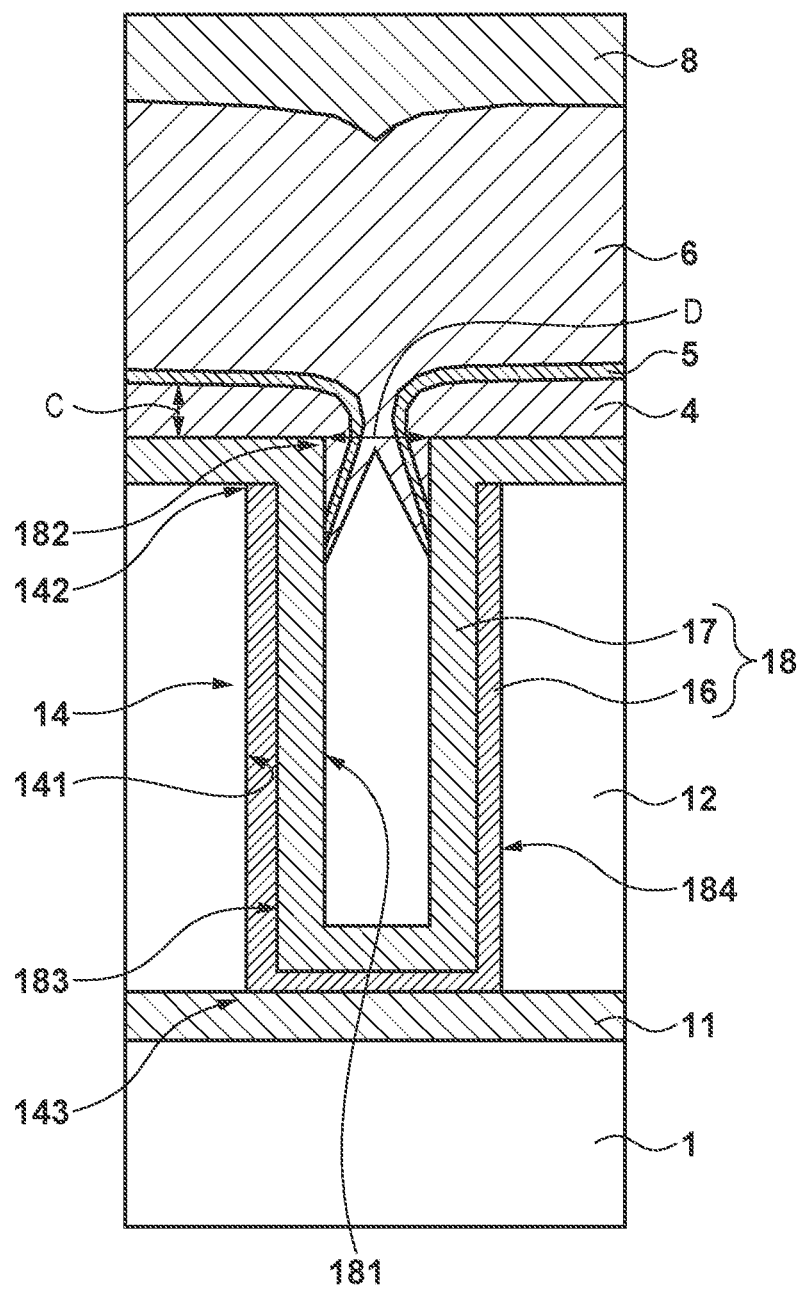
FIG. 3 is an enlarged view of a section showing an example of the arrangement of the organic device of FIG. 1.

An organic device according to an embodiment of the present invention will be described with reference to FIGS. 1 to 13. FIG. 1 is a sectional view showing an example of the arrangement of an organic device 100 according to the embodiment. FIG. 2 is a bird's eye view of an upper surface of a portion of the organic device 100. FIG. 3 is an enlarged view of a region B encircled by a dotted line in FIG. 1. In addition, a section taken along a line A-A' of FIG. 2 corresponds to FIG. 1 and shows an example in which a single pixel is formed by three light emitting elements 10. Although this embodiment shows an example of pixels in a delta array, the present invention is not limited to this. The pixels may be arranged in a striped array or a square array.

In this embodiment, the organic device 100 may be an organic light emitting device as to be described later. In such a case, an organic layer will include, for example, a light emitting layer. In addition, the organic device 100 according to this embodiment is not limited to an organic light emitting device. The organic device 100 may also be a photoelectric conversion device. In such a case, the organic layer will include, for example, a photoelectric conversion layer.

The organic device 100 includes a substrate 1 and the plurality of light emitting elements 10 arranged on the substrate 1. FIG. 1 shows three light emitting elements 10R, 10G, and 10B among the plurality of light emitting elements 10 included in the organic device 100. "R" of the light emitting element 10R indicates that the element emits red light. In a similar manner, "G" of the light emitting element 10G indicates that the element emits green light, and "B" of the light emitting element 10B indicates that the element emits blue light. In this specification, when indicating a specific light emitting element among the plurality of light emitting elements 10, a suffix such as "R" of the light emitting element 10R will be added following the reference numeral. In addition, when indicating any of the plurality of light emitting elements 10, it will be simply indicated as the light emitting element "10". This applies to other components in a similar manner.

The organic device 100 includes the substrate 1, conductive lines 9 and a conductive line 11 arranged on a main surface 19 of the substrate 1, an interlayer insulating layer 12 arranged on the conductive lines 9 and the conductive line 11, lower electrodes 2 arranged on the interlayer insulating layer 12, an organic layer 4 arranged on the lower electrodes 2, and an upper electrode 5 arranged on the organic layer 4. In addition, via holes 13 each provided with a conductive member 15 that electrically connects the corresponding conductive line 9 to the corresponding lower electrode 2 and a via hole 14 provided with a conductive member 18 that electrically connects the conductive line 11 to the upper electrode 5 are arranged in a region, of the interlayer insulating layer 12, where the organic layer 4 is arranged in an orthogonal projection with respect to the main surface 19. The lower electrodes 2 are electrodes separated in accordance with the respective light emitting elements 10 by an insulating layer 3. As shown in FIG. 1, the organic layer 4 is formed continuously on the substrate 1 and is shared by the plurality of light emitting element 10. Hence, in this embodiment, the region where the organic layer 4 is arranged in an orthogonal projection with respect to the main surface 19 is a region where the organic layer 4 is continuously (integrally) formed, and refers to a region including a portion where the organic layer 4 is not continuous (is not formed) such as inside the via hole 14.

A case in which the organic device 100 is a light emitting device will be described in detail here. In this embodiment, the organic device 100 is a top-emission device that extracts light from the upper electrode 5. Hence, the organic layer 4 includes a light emitting layer as a function layer. In addition, the organic device 100 can include a protective layer 6 arranged so as to cover the upper electrode 5 and a plurality of color filters 7 arranged in correspondence with the plurality of light emitting elements 10 on the protective layer 6. Furthermore, the organic device 100 may also include a planarization layer 8 between the protective layer 6 and the color filters 7. A case in which the organic device 100 is a light emitting device will be illustrated here. However, in a case in which the organic device 100 is a photoelectric conversion device, the organic layer 4 will include a photoelectric conversion layer as the function layer.

In this embodiment, the organic layer 4 emits white light, and color filters 7R, 7G, and 7B separate the white light emitted from the organic layer 4 into R, G, and B light beams, respectively. The color filters may also form a color conversion layer that absorbs light emitted from the organic layer 4 and coverts the absorbed light into another color.

In this embodiment, the terms "upper" and "lower" indicate the vertical direction in FIG. 1. Hence, a surface, of the lower electrode 2, on the side of the substrate 1 will be referred to as the "lower surface" of the lower electrode 2, and a surface, of the lower electrode 2, on the side of the organic layer 4 will be referred to as the "upper surface". Here, the lower surface of the lower electrode 2 indicates a surface in contact with the interlayer insulating layer 12. For example, in a case in which the conductive member 15 or the like for connecting to the conductive line 9 is connected to the lower surface of the lower electrode 2, a substantially flat portion excluding this connection portion will be the lower surface of the lower electrode 2.

Although not illustrated in FIG. 1, the substrate 1 may include a conductive line and a driving circuit including a transistor that are connected to the conductive lines 9 and the conductive line 11. The interlayer insulating layer 12 is arranged on the main surface 19 of the substrate 1. The interlayer insulating layer may be made of an inorganic compound, for example, silicon oxide, silicon nitride, silicon oxynitride, or the like. It may also be made of an organic compound such as polyimide, a polyacrylic compound, or the like. Since the organic layer 4 such as the function layer may degrade due to moisture, the interlayer insulating layer may be made of an inorganic material in the point of view preventing the entry of moisture. The interlayer insulating layer 12 may also be referred to as a planarization layer for the purpose of reducing unevenness of the surface on which the lower electrodes 2 are formed.

For example, a metal such as Al, Ag, or the like or an alloy obtained by doping such a metal with Si, Cu, Ni, Nd, or the like can be used for each of the conductive lines 9 and the conductive line 11. Each of the conductive lines 9 and the conductive line 11 may have a multilayer structure that includes a barrier layer. A metal such as Ti, W, Mo, Au, or the like or an alloy of such a metal may be used as the material of the barrier layer. The barrier layer may be a metal layer that forms the upper surface of each conductive line 9 and the conductive line 11. Although the conductive lines 9 and the conductive line 11 are arranged on the same wiring layer in the arrangement shown in FIG. 1, they may be arranged in different wiring layers from each other. Here, conductive lines which are arranged in the same wiring layer refer to, for example, conductive lines formed from the same conductive member film formed on the substrate 1 by using a lithography process or the like.

A metal such as Al, Ag, Cu, W, or the like or an alloy obtained by doping such metal with Si, Ni, Nd, or the like can be used as each conductive member 15. The conductive member 15 may also have a multilayer arrangement that includes a barrier layer. A metal such as Ti, W, Mo, Au, Ta, or the like or an alloy of such a metal can be used as the material of the barrier layer. The barrier layer can be a layer which is in contact with the surface, of the conductive member 15, on the side of the corresponding via hole 13.

A metal material which has a reflectance of 80% or higher with respect to the wavelength of emitted light from the organic layer 4 can be used for each lower electrode 2. For example, a metal such as Al, Ag, or the like or an alloy obtained by doping such a metal with Si, Cu, Ni, Nd, or the like can be used for each lower electrode 2. Here, the wavelength of emitted light indicates the range of the spectrum of light emitted from the organic layer 4. If the lower electrode 2 has a high reflectance with respect to the wavelength of emitted light from the organic layer 4, the lower electrode 2 may have a multilayer structure that includes a barrier layer. A metal such as Ti, W, Mo, Au, or the like or an alloy of such a metal may be used as the material of the barrier layer. The barrier layer may be a metal layer arranged on the upper surface of the lower electrode 2.

The conductive member 18 includes, as shown in FIG. 3, a surface 184 which is in contact with a side surface 141 of the via hole 14 and an inner wall 181 which is arranged along the side surface 141 of the via hole 14 on a side opposite to the surface 184. The conductive member 18 may have a multilayer structure that includes a member 16, which includes the surface 184 in contact with the side surface 141 of the via hole 14, and a member 17, which forms the inner wall 181 along the side surface 141 of the via hole 14. In this case, for example, the member 16 can contain the same material as the conductive member 15. Furthermore, the member 16 may be made of the same material as the conductive member 15. Also, in a case in which the conductive member 18 has a multilayer structure, the member 17 can contain, for example, the same material as each lower electrode 2. Furthermore, the member 17 may be made of the same material as each lower electrode 2. In this embodiment, as shown in FIGS. 1 and 3, the conductive member 18 has a two-layer structure formed by the member 16 and the member 17. However, it may have a multilayer structure of three layers or more.

The insulating layer 3 can cover the peripheral portion of each lower electrode 2 and be arranged between the organic layer 4 and each lower electrode 2. The top-view shape of the upper surface of the light emitting region of each light emitting element 10 may be a shape defined by a corresponding opening formed in the insulating layer 3. The insulating layer 3 suffices to have a function for electrically separating the lower electrodes 2 under the respective light emitting elements 10 and a function for defining the light emitting regions of the respective light emitting element 10, and is not limited to the shape shown in FIGS. 1 and 2.

The insulating layer 3 can be formed by, for example, a chemical vapor deposition method (CVD method), a physical vapor deposition method (PVD method), or the like. The insulating layer 3 may be made of, for example, silicon nitride (SiN), silicon oxynitride (SiON), silicon oxide (SiO), or the like. The insulating layer 3 may be a multilayer film made of silicon nitride, silicon oxynitride, silicon oxide, or the like.

The organic layer 4 is arranged between the upper electrode 5 and the lower electrodes 2 and the insulating layer 3. The organic layer 4 is formed continuously on the substrate 1 and may be shared by the plurality of light emitting elements 10. That is, the plurality of light emitting elements 10 may share one organic layer 4. The organic layer 4 may be integrally formed on the entire surface of the display region for displaying an image on the organic device 100 as a light emitting device.

The organic layer 4 may include a hole transport layer, a light emitting layer, and an electron transport layer. Appropriate materials can be selected for the organic layer 4 from the viewpoints of light emission efficiency, driving life expectancy, and optical interference. The hole transport layer can function as an electron blocking layer or a hole injection layer, and can also have a multilayered structure including a hole injection layer, a hole transport layer, and an electron blocking layer. The light emitting layer as a function layer can have a multilayered structure including light emitting layers for emitting different colors, and can also be a mixed layer in which light emitting dopants for emitting different colors are mixed. The electron transport layer can function as a hole blocking layer or an electron injection layer, and can also have a multilayered structure including an electron injection layer, an electron transport layer, and a hole blocking layer.

In addition, the organic layer 4 can also include an intermediate layer that is arranged between a plurality of function layers (light emitting layers) and a plurality of function layers. The organic device 100 may also be a light emitting device that has a tandem structure in which the intermediate layer is a charge generating layer. In a tandem structure, a charge transport layer such as a hole transport layer, an electron transport layer, or the like may be formed between a charge generating layer and a light emitting layer.

The charge generating layer is a layer that contains an electron donating material and an electron accepting material and generates an electric charge. The electron donating material is a material that donates an electron, and the electron accepting material is a material that accepts an electron. Since a positive charge and a negative charge are generated in the charge generating layer, the positive charge or the negative charge can be supplied to layers above and below the charge generating layer. The electron donating material may be, for example, an alkali metal such as lithium or cesium. Further, the electron donating material may be, for example, lithium fluoride, a lithium complex, cesium carbonate, a cesium complex, or the like. In this case, the electron donating property may be exhibited by also containing a reducible material such as aluminum, magnesium, or calcium together with the electron donating material. The electron accepting material may be, for example, an inorganic compound such as molybdenum oxide, or an organic compound such as [Dipyrazino[2,3-f:2',3'-h]quinoxaline-2,3,6,7,10,11-hexacarbonitrile]. The electron receiving material and the electron donating material may be mixed or stacked.

The upper electrode 5 is an electrode arranged on the organic layer 4. The upper electrode 5 is continuously formed on the substrate 1 and can be shared by the plurality of light emitting elements 10. The upper electrode 5 can be integrally formed, in a manner similar to the organic layer 4, over the entire display region for displaying an image on the organic device 100 as the light emitting device. The upper electrode 5 is a light-transmissive electrode for transmitting the light emitted by the light emitting layer of the organic layer 4. The upper electrode 5 may also be an electrode that transmits at least some of the light beams which have reached the lower surface of the upper electrode 5. The upper electrode 5 may function as a semi-transmissive reflective layer that transmits some of the light beams but reflects the remaining light beams (that is, a layer that has semi-transmissive reflectivity).

The upper electrode 5 can be made of, for example, a metal such as magnesium or silver, an alloy containing magnesium or silver as a main component, or an alloy material containing an alkali metal or an alkaline earth metal. An oxide conductor or the like may also be used as the upper electrode 5. The upper electrode 5 may have a multilayer structure as long as it has an appropriate transmittivity.

The protective layer 6 can be made of, for example, a material that has a low permeability to oxygen and moisture from the outside, such as silicon nitride, silicon oxynitride, aluminum oxide, silicon oxide, titanium oxide, or the like. Silicon nitride and silicon oxynitride may be formed using, for example, a CVD method. On the other hand, aluminum oxide, silicon oxide, and titanium oxide can be formed using an atomic layer deposition method (ALD method).

The combination of constituent materials and manufacturing methods of the protective layer 6 is not limited to those exemplified above, and may be appropriately selected in consideration of the thickness of the layer to be formed, the time required for forming the layer, and the like. The protective layer 6 may have a single-layer structure or a multilayer structure as long as it transmits light transmitted through the upper electrode 5 and has a sufficient moisture blocking performance.

Each color filter 7 can be formed on the protective layer 6. Like the color filter 7R and the color filter 7G shown in FIG. 1, the color filters 7 may be in contact with each other without a gap. Furthermore, the color filters of different colors may be arranged so as to overlap each other.

In this embodiment, the planarization layer 8 is formed between the protective layer 6 and the color filter 7. The planarization layer 8 may be made of, for example, an organic compound such as polyimide, a polyacrylic compound, or the like. It may also have a multilayer structure formed by using inorganic compounds and organic compounds.

In this embodiment, the via holes 13 and the via hole 14 are arranged, in an orthogonal projection with respect to the main surface 19 of the substrate 1, in a region where the organic layer 4 is formed. Since the via hole 14 where the conductive member 18 for connecting the conductive line 11 and the upper electrode 5 is arranged in a region where the organic layer 4 is arranged, the area of the region where the organic layer 4 is arranged (the area outside the region where the organic layer 4 is formed) can be reduced more than a case in which the via hole 14 is arranged outside the region where the organic layer 4 is arranged. This will reduce the area of the entire organic device 100, and many more organic devices 100 will be able to be obtained from a single substrate. As a result, it can lower the cost per organic device 100.

The via hole 14 may be formed while the light emitting elements 10 are being arranged. In this case, the via hole 14 will be arranged in the light emitting region where the organic layer 4 is arranged. Hence, it will be possible to suppress a potential drop in the upper electrode 5 at the central portion of the light emitting region more than a case in which the via hole 14 is arranged in a region where the organic layer 4 is not arranged. That is, it will be possible to easily supply a desired current to the organic layer 4, thereby allowing the display characteristics to be improved in a case in which the organic device 100 is a light emitting device. In addition, in a case in which the organic device 100 is a photoelectric conversion device, the characteristic of the image to be obtained can be improved.

The conductive member 15 for connecting the conductive line 9 and the lower electrode 2 is arranged in each via hole 13. In this embodiment, at least the upper portion of the via hole 13 is filled with the conductive member 15. For example, the conductive member 15 may be embedded without a gap in the upper portion of the via hole 13. As a result, it will be possible to suppress the upper surface of the lower electrode 2 from being formed unevenly on the via hole 13, and the upper surface of the lower electrode 2 will be flatter. Hence, thinning of the organic layer 4 arranged on the lower electrode 2 will hardly occur, thus suppressing the occurrence of a leak current between the upper electrode 5 and the lower electrode 2.

In this case, the upper portion of the via hole 13 may be a portion higher than ½ of the vertical length of the via hole 13. Alternatively, the upper portion of the via hole 13 may be a portion higher than ⅓ of the vertical length of the via hole 13. Furthermore, the upper portion of the via hole 13 may be a portion higher than ¼ of the vertical length or ⅕ of the vertical length of the via hole 13. In addition, the upper portion of the via hole 13 may be a portion where the conductive member 15 and the lower electrode 2 come into contact with each other.

In addition, as shown in FIG. 1, the via hole 13 may be filled entirely with the conductive member 15. In such a case, the lower portion, which is a region other than the above-described upper portion, of the via hole 13 may include a gap. The shape of the lower portion of the conductive member 15 in the via hole 13 suffices to be a shape that allows the conductive member 15 to electrically connect the conductive line 9 and the lower electrode 2 within a desired resistance value.

The arrangement for electrically connecting the upper electrode 5 to the conductive line 11 of the organic device 100 will be described in detail next with reference to FIG. 3.

As described above, the conductive member 18 includes the surface 184, which is in contact with the side surface 141 of the via hole 14, and the inner wall 181, which is arranged along the side surface 141 of the via hole 14 on a side opposite to the surface 184. The inner wall 181, of the conductive member 18, which is arranged along the side surface 141 of the via hole 14 can be a portion of the surface of the conductive member 18 which is approximately parallel to the side surface 141 of the via hole 14. Differing from the via hole 13, at least the upper portion of the via hole 14 includes a region that is not filled with the conductive member 18. The side surface 141 of the via hole 14 is covered by the conductive member 18 in the region that is not filled with the conductive member 18 of the via hole 14. Since the via hole 14 is not filled with the conductive member 18, the organic layer 4 is not formed on the inner wall 181 of the conductive member 18, and a region without the organic layer 4 is generated. Hence, the upper electrode 5 can include a portion that is in contact with the inner wall 181 of the conductive member 18 in the region, of the conductive member 18 arranged in the via hole 14, where the organic layer 4 is not formed of the inner wall 181 along the side surface 141 of the via hole 14. As a result, the upper electrode 5 and a circuit portion, such as a driving circuit or the like formed in the substrate 1, can be electrically connected via the conductive member 18 and the conductive line 11.

In an orthogonal projection with respect to the main surface 19 of the substrate 1, the length of between the portions that face each other of the side surface of each via hole 13 may be shorter than the length between the portions that face each other of the side surface 141 of the via hole 14. Here, the length between the portions of the side surface of each of the via holes 13 and 14 is a length from a portion of interest of the side surface to a portion present in a normal direction in an orthogonal projection with respect to the main surface 19 of the substrate 1. For example, in a case in which each of the via holes 13 and 14 has a circular shape, the length between the portions that face each other of the side surface of each of the via holes 13 and 14 is the length of the diameter of each of the circular via holes 13 and 14. Alternatively, in a case in which each of the via holes 13 and 14 has a square shape, the length between the portions that face each other of the side surfaces of each of the via holes 13 and 14 is the length of one side of each of the square via holes 13 and 14. Such an arrangement will allow, even in a case in which the conductive member 15 and the conductive member 18 are simultaneously formed, each via hole 13 to be filled with the conductive member 15 and the via hole 14 to have a structure which will not be filled with the conductive member 18.

In addition, each of the via holes 13 and 14 may have a tapered structure. Hence, in an orthogonal projection with respect to the main surface 19 of the substrate 1, the length between the portions that face each other of the upper end of the side surface of the via hole 13 can be shorter than the length between the portions that face each other of an upper end 142 of the side surface 141 of the via hole 14. The via holes 13 and 14 may have, other than a circular shape or a square shape, various kinds of shapes such as a rectangular shape, a polygonal shape, or the like, in an orthogonal projection with respect to the main surface 19 of the substrate 1. Hence, the area of the upper end of the via hole 13 may be smaller than the area of the upper end 142 of the via hole 14 in an orthogonal projection with respect to the main surface 19 of the substrate 1. The relationship between the lengths or the areas of the upper end of the side surface of each of the via holes 13 and the via hole 14 is applicable to a case in which the shape of each of the above-described via holes 13 and 14 is a circle or a square. By arranging each of the via holes 13 and 14 to have such a relationship, each via hole 13 will have a structure in which it is filled with the conductive member 15, and the via hole 14 will have a structure in which it is not embedded with the conductive member 18.

As shown in FIG. 3, the organic layer 4 may cover a part of the inner wall 181, of the conductive member 18, including an upper end 182 of the inner wall 181 along the side surface 141 of the via hole 14. This will suppress a state in which the upper electrode 5 becomes thin in a portion where the upper electrode 5 on the organic layer 4 bends toward inside the via hole 14 from a direction parallel to the main surface 19 of the substrate 1. Furthermore, this can also suppress a state in which the upper electrode 5 will not be partially formed. As a result, the resistance value of the upper electrode 5 will rise, thus creating a state that can suppress the operation voltage of the organic device 100 from increasing. If a general semiconductor process is used, the upper end 142 of the side surface 141 of the via hole 14 will have an angular shape. Also, the upper end 182 of the inner wall 181 of the conductive member 18 formed so as to cover the via hole 14 will tend to have an angular shape. On the other hand, the formation of the organic layer 4 on the angular upper end 182 of the inner wall 181 of the conductive member 18 can cause the upper surface of the organic layer 4 to be formed in a curved shape. Hence, it will be possible to suppress the upper electrode 5 arranged on the organic layer 4 from thinning. The manufacturing process of the organic device 100 will be described later.

Japanese Patent Laid-Open No. 2018-129265 discloses that deposition is performed so as not to form an organic layer (electron transport layer) on the side surface of a concave portion of a power supply auxiliary electrode layer. In such a case, the shape of an upper electrode (common electrode layer) will rapidly change in a portion where the upper electrode bends toward the side surface of the concave portion, thus increasing the possibility that the film thickness of the upper electrode will decrease. In contrast, according to this embodiment, the organic layer 4 formed on the upper end 182 of the inner wall 181 of the conductive member 18 will cover a portion of the inner wall 181 of the conductive member 18, and the upper surface of the organic layer 4 will have a curved shape. Hence, the change in the shape of the upper electrode 5 will be moderate, and a state in which the film thickness of the upper electrode 5 will decrease and a state in which a portion of the upper electrode 5 will not be partially formed can be suppressed.

In addition, an effect of the organic layer 4 covering a portion of the inner wall 181 including the upper end 182 of the inner wall 181 of the conductive member 18 is the improvement of the moisture blocking performance of the protective layer 6. A case in which the protective layer 6 is formed on an angular shape such as that of the upper end 182 of the inner wall 181 of the conductive member 18 will be considered. In this case, during the growth process of the protective layer 6, the density of the protective layer 6 will tend to decrease in a region where a portion of the protective layer 6 which is to be grown above the inner wall 181 of the conductive member 18 and a portion of the protective layer 6 which is to be grown above the upper surface of the conductive member 18 are to meet. Since the region where the density of the protective layer 6 has decreased reaches the lower portion of the protective layer 6, it will allow moisture to more easily enter the organic layer 4 via this low-density region. In contrast, according to this embodiment, since the organic layer 4 covers a portion of the inner wall 181 including the upper end 182 of the inner wall 181 of the conductive member 18, the upper surface of the organic layer 4 will have a curved shape and have a structure in which its slope angle will continuously change. Hence, portions of the protective layer 6 that have grown different slope angles will continuously meet, thus suppressing the formation of a region where the density of the protective layer 6 will decrease.

Furthermore, a length D between portions that face each other of the upper end 182 of the inner wall 181, of the conductive member 18, along the side surface 141 of the via hole 14 in an orthogonal projection with respect to the main surface 19 of the substrate 1 may be longer than twice a thickness C of the organic layer 4 (D>2C). This will suppress a state in which the inner side of the inner wall 181 of the conductive member 18 will be embedded in the organic layer 4. As a result, it will be possible to bring the upper electrode 5 and the conductive member 18 into contact with each other more easily.

As described above, according to this embodiment, by filling the upper portion of the via hole 13 with the conductive member 15 and suppressing the formation of unevenness on the upper surface of the lower electrode 2 formed on the via hole 13, the thinning of the organic layer 4 arranged on the upper surface of the lower electrode 2 will be suppressed. As a result, the generation of a leak current between the upper electrode 5 and the lower electrode 2 will also be suppressed. Furthermore, the via hole 14 in which the conductive member 18 for connecting the conductive line 11 and the upper electrode 5 is arranged is arranged inside the region where the organic layer 4 is arranged. Hence, the area of the region without the organic layer 4 is reduced, and the area of the entire of the organic device 100 is reduced. As a result, it becomes possible to suppress the cost per organic device 100 as described above. Furthermore, thinning of the upper electrode 5 is suppressed based on the above-described shapes of the upper electrode 5 and the organic layer 4 formed near the upper end 182 of the inner wall 181 of the conductive member 18, and it will be possible to more reliably bring the upper electrode 5 and the conductive member 18 into contact with each other. As a result, the reliability of the organic device 100 can be improved. In this manner, according to this embodiment, it is possible to suppress the manufacturing cost of the organic device 100, and to implement the organic device 100 in which the generation of a leak current between the upper electrode 5 and the lower electrode 2 is suppressed. Furthermore, the organic device 100 that has a high reliability can be implemented.

Figure 4A:
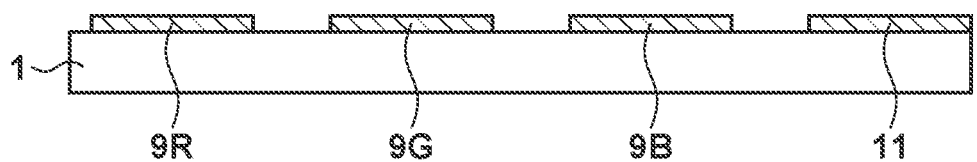
FIGS. 4A to 4E are views showing a method of manufacturing the organic device of FIG. 1.
Figure 4B:
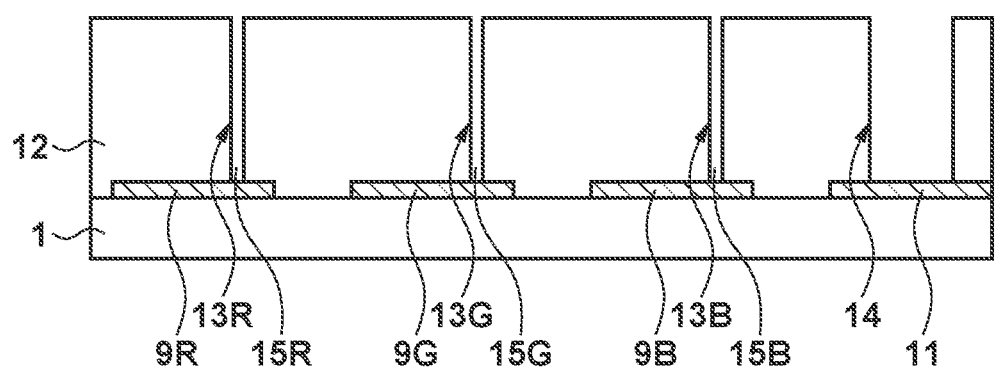

The method of manufacturing the organic device 100 described above will be described next with reference to FIGS. 4A to 4E. First, after a conductive layer made of a metal or the like is formed on the substrate 1, each conductive line 9 and the conductive line 11 are formed by using a photolithography method as shown in FIG. 4A. Next, the interlayer insulating layer 12 is deposited, and the upper surface of the interlayer insulating layer 12 is planarized by using, for example, a CMP method, an etch-back method, or the like. In addition, as shown in FIG. 4B, each via hole 13 and the via hole 14 that extend through the interlayer insulating layer 12 are formed.

Figure 4C:
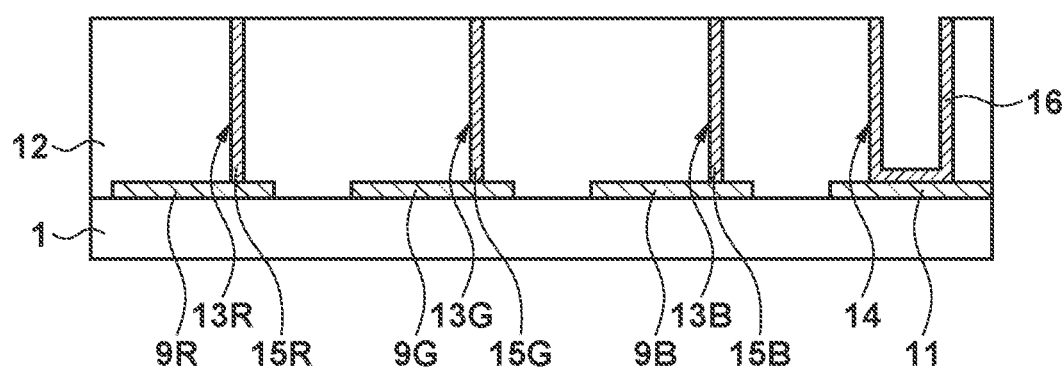

Next, each conductive member 15 and the member 16 that includes the surface 184, of the conductive member 18, which is to contact the side surface 141 of the via hole 14 are formed. First, a CVD method or the like is used to form a first material film of each of the conductive members 15 and the member 16. At this time, each via hole 13 can be filled with the first material film. On the other hand, in the via hole 14, the first material film will only cover the side surface 141 and will not be embedded in the via hole 14. Next, the first film material formed on the upper surface of the interlayer insulating layer 12 is polished or etched by using a CMP method, an etch-back method, or the like, and each conductive member 15 and the member 16 are formed as shown in FIG. 4C.

Figure 4D:
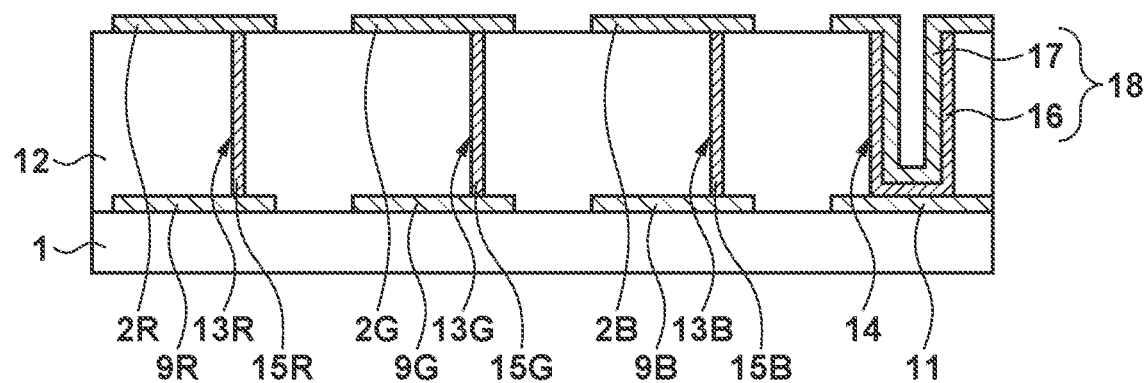

Next, each lower electrode 2 and the member 17 of the conductive member 18 are formed. First, a sputtering method or the like is used to form a second material film of each of the lower electrodes 2 and the member 17. Next, each lower electrode 2 and the member 17 are formed as shown in FIG. 4D by performing patterning by using a photolithography method or the like.

Subsequently, a sputtering method or the like is used to form a third material film of the insulating layer 3, and patterning is performed by using a photolithography method or the like. The conductive member 18 formed in the via hole 14 needs to be exposed in this process. That is, since the third material film formed on the inner wall 181 of the conductive member 18 needs to be etched, isotropic dry-etching or wet-etching may be used in the etching process of the third material film. The insulating layer 3 will be formed as shown in FIG. 4E by this process.

The inner wall 181 which is the upper surface of the conductive member 18 may be made of titanium or an alloy containing titanium. By making the inner wall 181 of the conductive member 18 contain titanium, it will be possible to improve the process resistance after the formation of the conductive member 18 as well as to suppress the formation of an oxide film (insulating film) on the inner wall 181 of the conductive member 18. Hence, even in a case in which the formation process of the organic layer 4 and the upper electrode 5 is performed after the structure shown in FIG. 4E has undergone atmospheric exposure, it will be possible to suppress an increase in the resistance value due to the presence of an insulating film between the upper electrode 5 and the conductive member 18. As a result, it will be possible to prevent an increase in the operation voltage of the organic device 100.

Figure 5A:
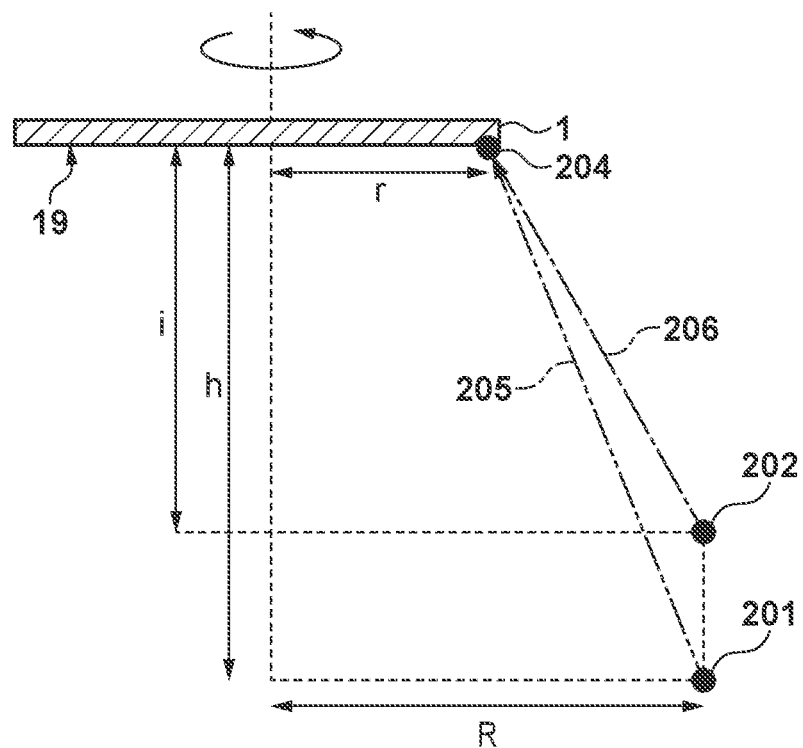
FIGS. 5A and 5B are a view showing the method of manufacturing the organic device of FIG. 1.

The formation of the organic layer 4 and the upper electrode 5 will be described next with reference to FIGS. 5A and 5B. FIG. 5A is a view showing a positional relationship between deposition sources 201 and 202 and the substrate 1 when the organic layer 4 and the upper electrode 5 are to be formed. The substrate 1 is rotated when the organic layer 4 and the upper electrode 5 are to be formed. The deposition source 202 for forming the organic layer 4 and the deposition source 201 for forming the upper electrode 5 are both arranged in positions at a distance R from the center of the rotation of the substrate 1 in a direction parallel to the main surface 19 of the substrate 1. In addition, the deposition source 202 for forming the organic layer 4 is arranged in a position at a distance i from the center of the rotation of the substrate 1 in a direction perpendicular to the main surface 19 of the substrate 1. Furthermore, the deposition source 201 for forming the upper electrode 5 is arranged in a position at a distance h from the center of the rotation of the substrate 1 in a direction perpendicular to the main surface 19 of the substrate 1. At this time, the distance i is shorter than the distance h. That is, the deposition source 202 for forming the organic layer 4 is arranged in a position closer to the substrate 1 than the position of the deposition source 201 for forming the upper electrode 5. In FIG. 5A, the deposition source 201 and the deposition source 202 are illustrated as if they are arranged in a single deposition apparatus (chamber). However, FIG. 5A is merely a view for showing the positional relationship between the substrate 1 and the deposition sources 201 and 202 when the organic layer 4 and the upper electrode 5 are to be formed. Hence, the deposition source 201 and the deposition source 202 may be arranged in separate deposition apparatuses (chambers) or may be arranged in the same deposition apparatus (chamber).

Figure 4E:
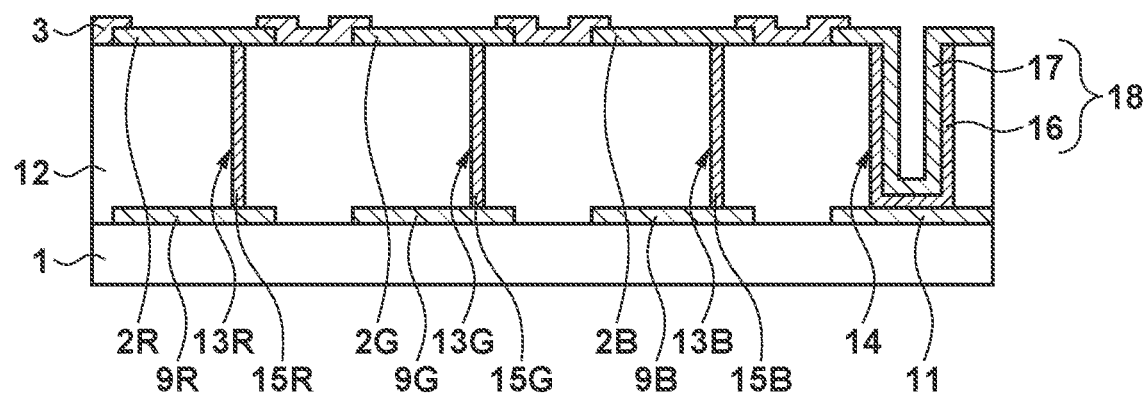
Figure 5B:
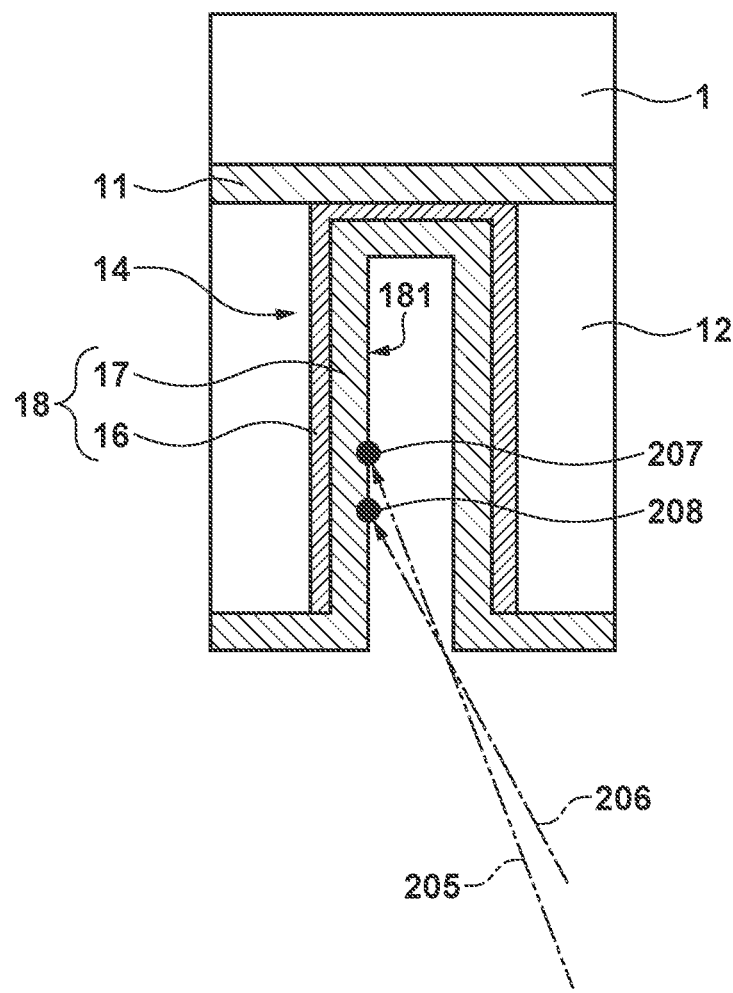

FIG. 5B is an enlarged view of the organic device 100, which has been formed up to the process of FIG. 4E described above, in a position 204 from a distance r from the center of the rotation of the substrate 1. Based on the arrangement described with reference to FIG. 5A, an angle 205 of incidence at which the deposition material enters from the deposition source 201 for forming the upper electrode 5 will be different from an angle 206 of incidence at which the deposition material enters from the deposition source 202 for forming the organic layer 4. As a result, the deposition material for the upper electrode 5 will reach a position 207 that is deeper than a position 208 which is the limit of the depth at which the deposition material for the organic layer 4 enters the via hole 14. As a result, the upper electrode 5 can come into contact with the inner wall 181 of the conductive member 18. Although a case using a deposition method as the formation method of the organic layer 4 has been described here, the organic layer 4 may also be formed by using, for example, a laser ablation method or the like.

Figure 6:
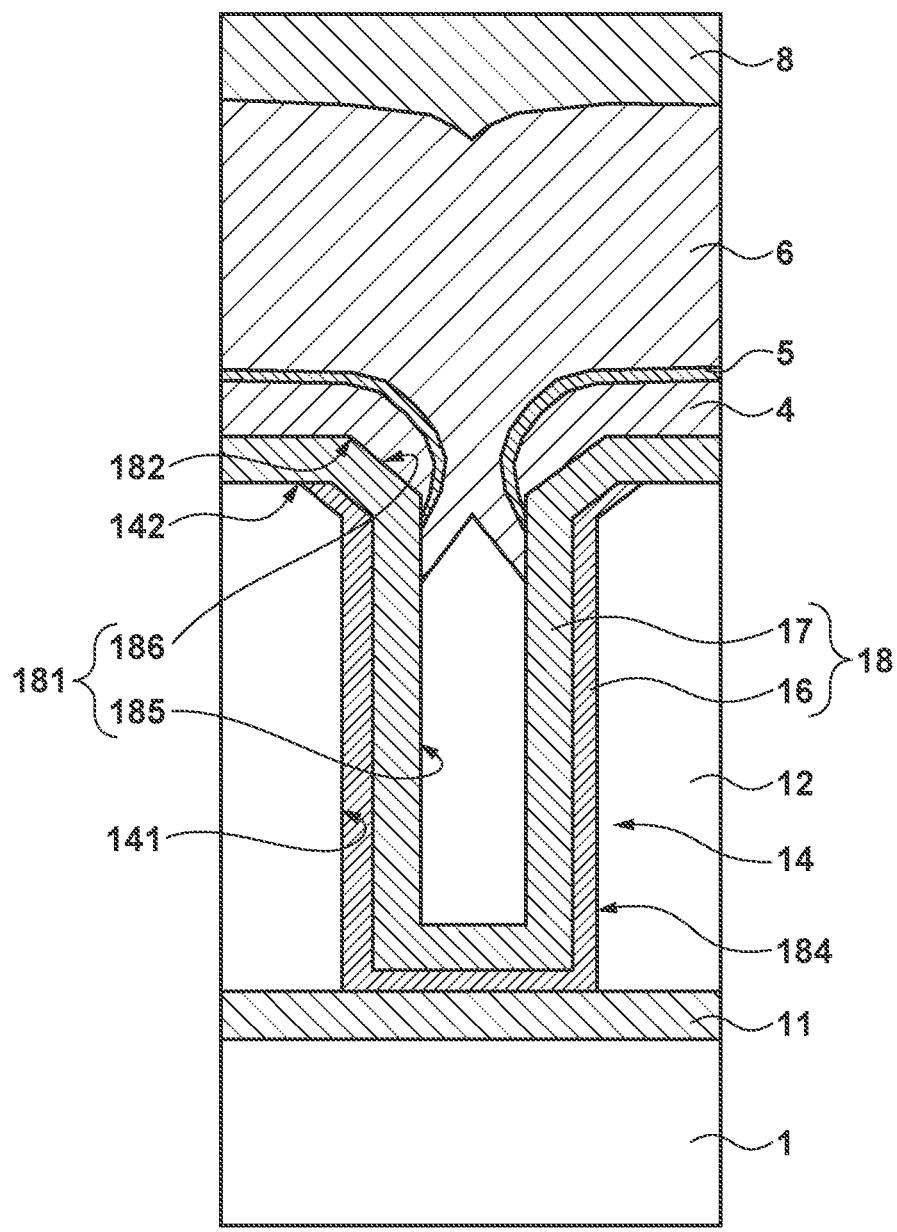
FIG. 6 is a view showing a modification of the section shown in FIG. 3.

FIG. 6 is a view showing a modification of the via hole 14 and the conductive member 18 shown in FIG. 3. In the arrangement shown in FIG. 6, the inner wall 181, of the conductive member 18, along the side surface 141 of the via hole 14 includes a slope portion 185 whose angle with respect to a surface parallel to the main surface 19 of the substrate 1 is a first angle and a slope portion 186 which is arranged between the slope portion 185 and the upper end 182 of the inner wall 181 and whose angle with respect to a surface parallel to the main surface 19 is a second angle smaller than the first angle. That is, the slope of a portion close to the upper ends 142 and 182 of the conductive member 18 and the via hole 14 has become moderate. By arranging so that the slope of the inner wall 181 of the region close to the upper end 182 of the conductive member 18 will become more moderate, it will become more difficult for the upper electrode 5 to become thin and more difficult for a low-density region to be generated in the protective layer 6 than the arrangement shown in FIG. 3. That is, it will be possible to further increase the reliability of the organic device 100.

The structure shown in FIG. 6 can be formed by etching, under a high isotropic condition, the portion, of the via hole 14, where the slope portion 186 is to be arranged. For example, dry etching can be performed under a high anisotropic condition to cause the via hole 14 to extend through the interlayer insulating layer, and dry etching or wet etching can be performed under a high isotropic condition to form a portion, of the via hole 14, where the slope portion 186 is to be arranged. Either the etching under the high anisotropic condition or the etching under the high isotropic condition can be performed first.

The light emitting element 10 will be described here. Each of the light emitting elements 10 is arranged by forming, on the substrate 1, an anode, an organic compound layer, and a cathode. The protective layer 6 and the color filter 7 can be formed on the cathode. If the color filter 7 is to be arranged, the planarization layer 8 may be arranged between the protective layer 6 and the color filter 7. The planarization layer 8 can be made of an acrylic resin or the like.

The above embodiment described that a semiconductor substrate such as silicon or the like will be used as the substrate 1. However, the present invention is not limited to this. Quartz, glass, a silicon wafer, a resin, a metal, or the like can be used as the substrate 1. In addition, as described in the above embodiment, a switching element such as a transistor or the like and conductive lines can be arranged on the substrate 1, and an insulating later can be arranged on these elements. The material of the insulating layer is not particularly limited as long as it is a material that can form a contact hole for ensuring conductance between the anode of the light emitting element 10 and the transistor formed in the substrate and can ensure insulation from a conductive line which is not to be connected. For example, a resin such as polyimide or the like, silicon oxide, silicon nitride, or the like may be used.

A pair of electrodes (the upper electrode 5 and each lower electrode 2 described above) can be used as the electrodes. The pair of electrodes may have an anode and a cathode. If an electric field is to be applied in a direction in which each light emitting element 10 is to emit light, the electrode with the higher potential will be the anode and the other electrode will be the cathode. It can be also said that the electrode that supplies holes to the light emitting layer of the light emitting element 10 is the anode and the electrode that supplies electrons is the cathode.

As the constituent material of the anode, a material having a large work function can be used. For example, a metal such as gold, platinum, silver, copper, nickel, palladium, cobalt, selenium, vanadium, or tungsten, a mixture containing some of them, an alloy obtained by combining some of them, or a metal oxide such as tin oxide, zinc oxide, indium oxide, indium tin oxide (ITO), or zinc indium oxide can be used as the anode. Furthermore, a conductive polymer such as polyaniline, polypyrrole, or polythiophene can also be used as the anode.

One of these electrode materials may be used singly, or two or more of them may be used in combination. The anode may be formed by a single layer or a plurality of layers.

When the anode is used as a reflective electrode, for example, chromium, aluminum, silver, titanium, tungsten, molybdenum, an alloy thereof, a stacked layer thereof, or the like can be used. When the anode is used as a transparent electrode, an oxide transparent conductive layer made of indium tin oxide (ITO), indium zinc oxide, or the like can be used, but the present invention is not limited thereto. A photolithography technique can be used to form the electrode.

On the other hand, as the constituent material of the cathode, a material having a small work function can be used. Examples of the material include an alkali metal such as lithium, an alkaline earth metal such as calcium, a metal such as aluminum, titanium, manganese, silver, lead, or chromium, and a mixture containing some of them. Alternatively, an alloy obtained by combining these metals can also be used. For example, a magnesium-silver alloy, an aluminum-lithium alloy, an aluminum-magnesium alloy, a silver-copper alloy, a zinc-silver alloy, or the like can be used as the cathode. A metal oxide such as indium tin oxide (ITO) can also be used. One of these electrode materials may be used singly, or two or more of them may be used in combination. The cathode may have a single-layer structure or a multilayer structure. For the cathode, silver may be used, or a silver alloy may be used to suppress aggregation of silver. The ratio of the alloy is not limited as long as aggregation of silver can be suppressed. For example, the ratio between silver and a material other than silver may be 1:1.

The cathode may be a top emission element using an oxide conductive layer made of ITO or the like, or may be a bottom emission element using a reflective electrode made of aluminum (Al) or the like, and is not particularly limited. The method of forming the cathode is not particularly limited, but if direct current sputtering or alternating current sputtering is used, the good film coverage is provided and the resistance is easily lowered.

The protective layer 6 may be provided on the cathode. For example, by adhering glass provided with a moisture absorbing agent on the cathode, permeation of water or the like into the light emitting layer such as an organic EL layer can be suppressed and occurrence of display defects can be suppressed. Furthermore, as another embodiment, a passivation film made of silicon nitride or the like may be provided on the cathode to suppress permeation of water or the like into the light emitting layer. For example, after forming the cathode and transferring it to another chamber without breaking the vacuum, a silicon nitride film having a thickness of 2 μm may be formed by a chemical vapor deposition method (CVD method), thereby obtaining the protective layer 6. The protective layer 6 may be provided using an atomic deposition method (ALD method) after forming a film using the CVD method.

The color filter 7 may be provided on the protective layer 6. For example, the color filter 7 with consideration to the size of the light emitting element 10 may be provided on another substrate, and the substrate with the color filter 7 provided thereon may be bonded to the substrate 1 with the light emitting element 10 provided thereon. Alternatively, the color filter 7 may be patterned on the above-described protective layer 6 by using a photolithography technique. The color filter 7 may be formed from a polymeric material.

The planarization layer 8 may be provided between the color filter 7 and the protective layer 6. The planarization layer 8 may be formed from an organic compound, and may be made of a low-molecular material or a polymeric material. For example, the planarization layer 8 can be formed from a polymeric organic compound.

The planarization layer 8 may be provided above and below the color filter, and the same or different materials may be used for them. More specifically, examples of the material include polyvinyl carbazole resin, polycarbonate resin, polyester resin, ABS resin, acrylic resin, polyimide resin, phenol resin, epoxy resin, silicone resin, and urea resin.

A counter substrate may be provided on the planarization layer 8. The counter substrate is called a counter substrate because it is provided at a position corresponding to the above-described substrate. The constituent material of the counter substrate may be the same as that of the above-described substrate 1.

The organic layer 4 (hole injection layer, hole transport layer, electron blocking layer, light emitting layer, hole blocking layer, electron transport layer, electron injection layer, and the like) forming the light emitting element 10 according to an embodiment of the present invention is formed by the method to be described below. The organic layer 4 can be formed by a dry process using a vacuum deposition method, an ionization deposition method, a sputtering method, a plasma method, or the like. Instead of the dry process, a wet process that forms a layer by dissolving a solute in an appropriate solvent and using a well-known coating method (for example, a spin coating method, a dipping method, a casting method, an LB method, an inkjet method, or the like) can be used.

Here, when the organic layer 4 is formed by a vacuum deposition method, a solution coating method, or the like, crystallization or the like hardly occurs and excellent temporal stability is obtained. Furthermore, when the organic layer 4 is formed using a coating method, it is possible to form the film in combination with a suitable binder resin.

Examples of the binder resin include polyvinyl carbazole resin, polycarbonate resin, polyester resin, ABS resin, acrylic resin, polyimide resin, phenol resin, epoxy resin, silicone resin, and urea resin. However, the binder resin is not limited to them.

One of these binder resins may be used singly as a homopolymer or a copolymer, or two or more of them may be used in combination. Furthermore, additives such as a well-known plasticizer, antioxidant, and an ultraviolet absorber may also be used as needed.

Figure 7:
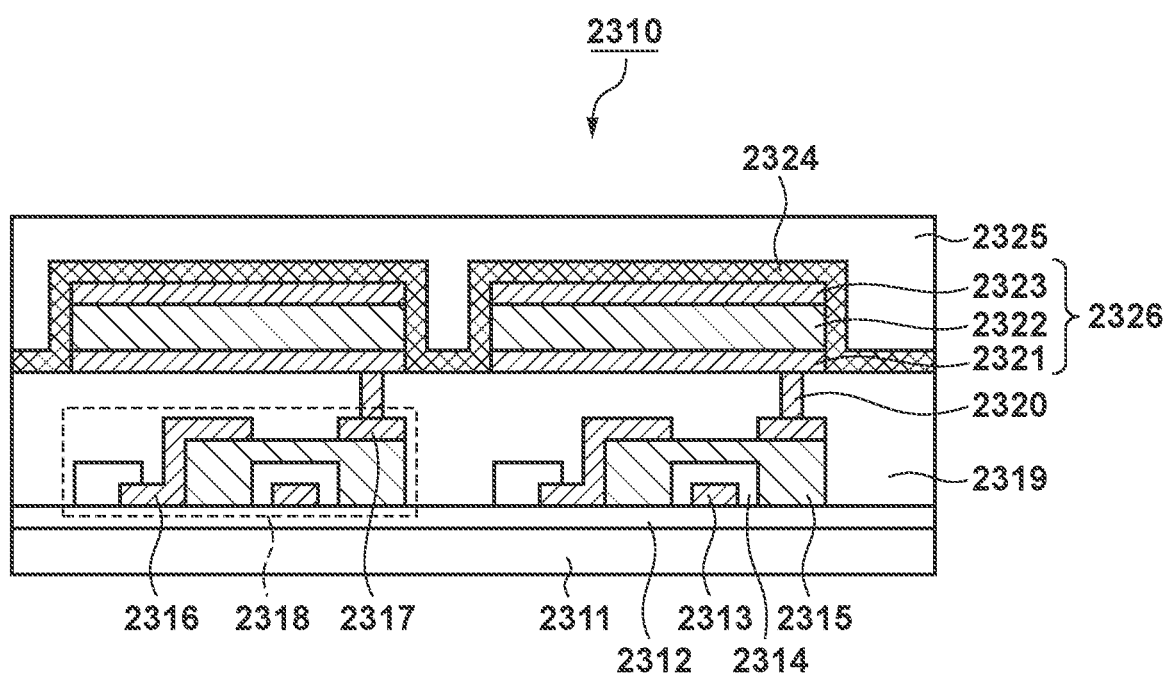
FIG. 7 is a sectional view showing an example of the arrangement of a light emitting device according to the embodiment.

Next, a light emitting device according to this embodiment will be described with reference to the accompanying drawings. FIG. 7 is a schematic sectional view showing an example of the organic device 100 including a light emitting element 2326 as an example of the above-described light emitting element 10 and a TFT element connected to the light emitting element 2326. The TFT element is an example of an active element.

A light emitting device 2310 as an example of the organic device 100 shown in FIG. 7 is provided with a substrate 2311 of glass, silicon, or the like and an insulating layer 2312 thereon. An active element such as a TFT 2318 is arranged on the insulating layer 2312, and a gate electrode 2313, a gate insulating film 2314, and a semiconductor layer 2315 of the TFT 2318 are arranged. The TFT 2318 shown in FIG. 7 is an example of a driving circuit of a transistor. The TFT 2318 further includes the semiconductor layer 2315, a drain electrode 2316, and a source electrode 2317. An insulating film 2319 is provided on the TFT 2318. The source electrode 2317 and an anode 2321 forming the light emitting element are connected via a contact hole 2320 formed in the insulating film 2319.

Note that a method of electrically connecting the electrodes (anode and cathode) included in the light emitting element and the electrodes (source electrode and drain electrode) included in the TFT is not limited to the that shown in FIG. 7. That is, one of the anode and cathode and one of the source electrode and drain electrode of the TFT 2318 are electrically connected. The TFT indicates a thin-film transistor.

In the light emitting device 2310 shown in FIG. 7, an organic layer 2322 is illustrated as one layer. However, the organic layer 2322 may include a plurality of layers. Protective layers 2324 and 2325 are provided on a cathode 2323 to suppress the degradation of the light emitting element.

A transistor is used as a switching element in the light emitting device 2310 shown in FIG. 7 but may be used as another switching element.

The transistor used in the light emitting device 2310 shown in FIG. 7 is not limited to a transistor using a single-crystal silicon wafer, and may be a thin-film transistor including an active layer on an insulating surface of a substrate. Examples of the active layer include single-crystal silicon, amorphous silicon, non-single-crystal silicon such as microcrystalline silicon, and a non-single-crystal oxide semiconductor such as indium zinc oxide and indium gallium zinc oxide. Note that the thin-film transistor is also called a TFT element.

The transistor included in the light emitting device 2310 shown in FIG. 7 may be formed in a substrate such as an Si substrate. Here, being formed in a substrate means that a transistor is formed by processing the substrate itself such as an Si substrate. In other words, including a transistor in a substrate can be regarded as integrally forming the substrate and the transistor.

The light emission luminance of the light emitting element 10 according to this embodiment is controlled by the TFT which is an example of a switching element, and the light emitting elements are provided in a plurality of planes to display an image with the light emission luminances of the respective elements. Note that the switching element according to this embodiment is not limited to the TFT, and may be a transistor formed from low-temperature polysilicon or an active matrix driver formed on the substrate such as an Si substrate. The term "on the substrate" may mean "in the substrate". Whether to provide a transistor in the substrate or use a TFT is selected based on the size of the display unit. For example, if the size is about 0.5 inch, the organic light emitting element may be provided on the Si substrate.

Application examples in which the organic device 100 of each of the above-described embodiments is applied to a display device, a photoelectric conversion device, an electronic device, an illumination device, and a mobile device will be explained below with reference to FIGS. 8 to 13. That is, application examples of the organic device in a case in which the above-described organic layer 4 includes a light emitting layer will be described. In addition, the organic device 100 is applicable to the exposure light source of an electrophotographic image forming device, the backlight of a liquid crystal display device, a light emitting device including a color filter in a white light source, and the like. The display device may be an image information processing device that includes an image input unit for inputting image information from an area CCD, a linear CCD, a memory card, or the like, and an information processing unit for processing the input information, and displays the input image on a display unit. In addition, a display unit included in a camera or an inkjet printer may have a touch panel function. The driving type of the touch panel function may be an infrared type, a capacitance type, a resistive film type, or an electromagnetic induction type, and is not particularly limited. The display device may be used for the display unit of a multifunction printer.

Figure 8:
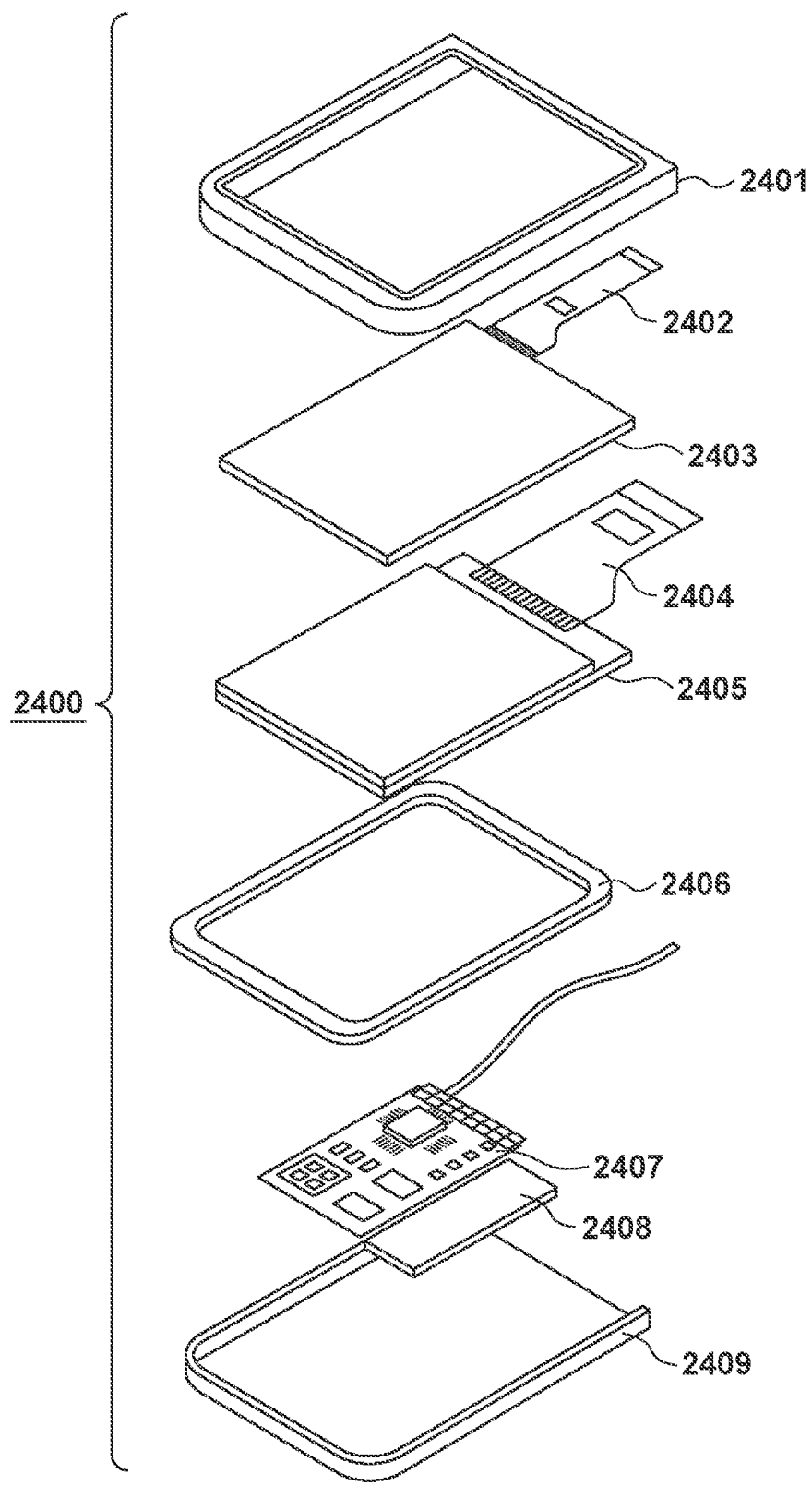
FIG. 8 is a view showing an example of a display device using the light emitting device according to the embodiment.

FIG. 8 is a schematic view showing an example of the display device using the organic device 100 according to this embodiment. A display device 2400 can include a touch panel 2403, a display panel 2405, a frame 2406, a circuit board 2407, and a battery 2408 between an upper cover 2401 and a lower cover 2409. Flexible printed circuits (FPCs) 2402 and 2404 are respectively connected to the touch panel 2403 and the display panel 2405. Active elements such as transistors are arranged on the circuit board 2407. The battery 2408 is unnecessary if the display device 2400 is not a portable device. Even when the display device 2400 is a portable device, the battery 2408 need not be provided in this position. The above-described organic device 100 in which the light emitting layer of the organic layer 4 contains an organic light emitting material such as an organic EL is applicable to the display panel 2405. The organic device 100 that functions as the display panel 2405 operates by being connected to the active elements such as transistors arranged on the circuit board 2407.

The display device 2400 shown in FIG. 8 may also be used as a display unit of a photoelectric conversion device (imaging device) including an optical unit having a plurality of lenses, and an imaging element for receiving light having passed through the optical unit and photoelectrically converting the light into an electrical signal. The photoelectric conversion device can have a display unit for displaying information acquired by the imaging element. In addition, the display unit can be either a display unit exposed outside the photoelectric conversion device, or a display unit arranged in the finder. The photoelectric conversion device may also be a digital camera or a digital video camera. In addition, the organic device 100, according to this embodiment, in which the function layer of the organic layer 4 includes a photoelectric conversion layer may be used as a photoelectric conversion element of a photoelectric conversion device.

Figure 9:
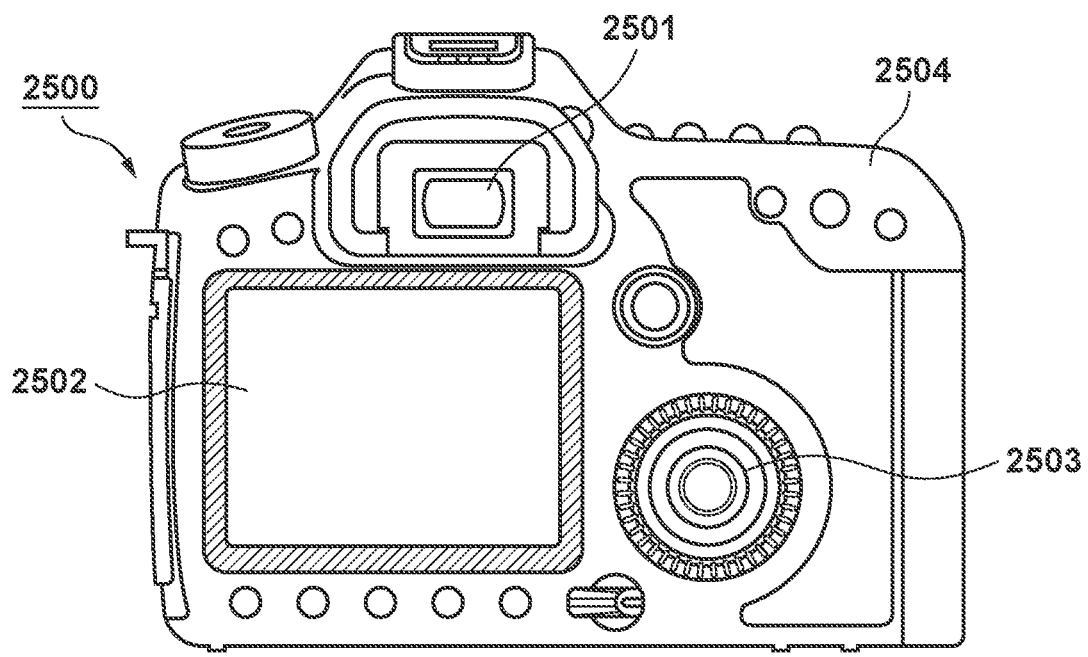
FIG. 9 is a view showing an example of a photoelectric conversion device using the light emitting device according to the embodiment.

FIG. 9 is a schematic view showing an example of the photoelectric conversion device using the organic device 100 according to this embodiment. A photoelectric conversion device 2500 can include a viewfinder 2501, a rear display 2502, an operation unit 2503, and a housing 2504. The photoelectric conversion device 2500 can also be referred to as an imaging device. The above-described organic device 100 in which the light emitting layer of the organic layer 4 contains the organic light emitting material is applicable to the viewfinder 2501 as a display unit. In this case, the organic device 100 can display not only an image to be captured but also environment information, imaging instructions, and the like. Examples of the environment information are the intensity and direction of external light, the moving velocity of an object, and the possibility that an object is covered with an obstacle.

The timing suitable for imaging is often a very short time, so the information is preferably displayed as soon as possible. Accordingly, the above-described organic device 100 in which the light emitting layer of the organic layer 4 contains the organic light emitting material can be used as the viewfinder 2501. This is so because the organic light emitting material has a high response speed. For the organic device 100 using the organic light emitting material, a display speed is obtained. The organic device 100 is more suitable for these devices than a liquid crystal display device.

The photoelectric conversion device 2500 includes an optical unit (not shown). This optical unit has a plurality of lenses, and forms an image of light having passed through the optical unit on a photoelectric conversion element (not shown) that is accommodated in the housing 2504 and receives the light. The focal points of the plurality of lenses can be adjusted by adjusting the relative positions. This operation can also automatically be performed.

The above-described organic device 100 in which the light emitting layer of the organic layer 4 contains the organic light emitting material may be applied to the display unit of the electronic device. At this time, the organic device 100 can have both a display function and an operation function. Examples of the portable terminal are a portable phone such as a smartphone, a tablet, and a head mounted display.

Figure 10:
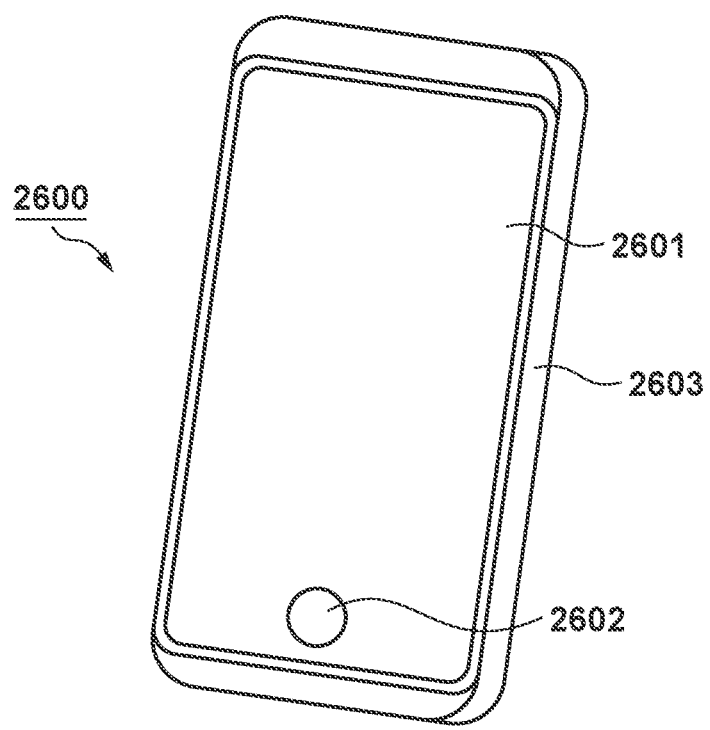
FIG. 10 is a view showing an example of an electronic device using the light emitting device according to the embodiment.

FIG. 10 is a schematic view showing an example of the electronic device using the organic device 100 according to this embodiment. An electronic device 2600 includes a display unit 2601, an operation unit 2602, and a housing 2603. The housing 2603 can accommodate a circuit, a printed board having this circuit, a battery, and a communication unit. The operation unit 2602 can be either a button or a touch-panel-type reaction unit. The operation unit 2602 can also be a biometric authentication unit that performs unlocking or the like by authenticating the fingerprint. A portable device including a communication unit can also be regarded as a communication device. The above-described organic device 100 in which the light emitting layer of the organic layer 4 contains the organic light emitting material is applicable to the display unit 2601.

Figure 11A:
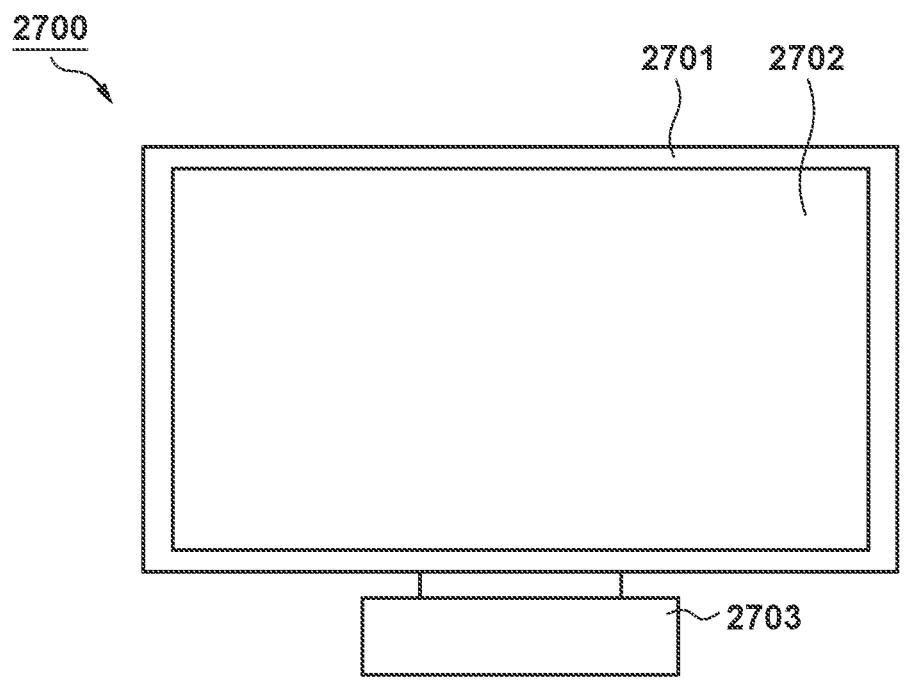
FIGS. 11A and 11B are views each showing an example of a display device using the light emitting device according to the embodiment.
Figure 11B:
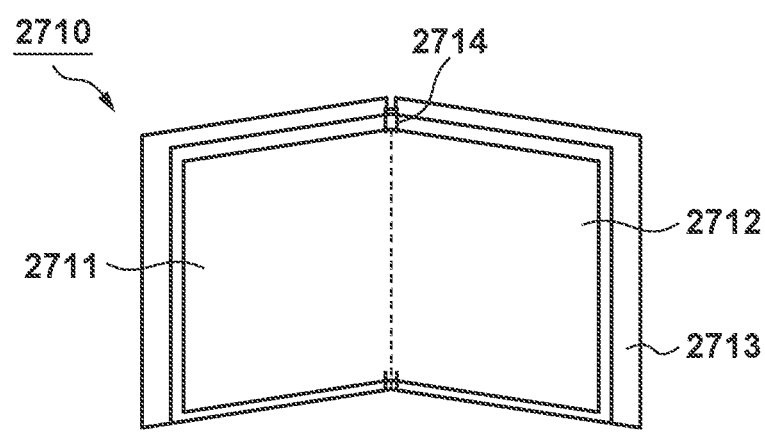

FIGS. 11A and 11B are schematic views showing examples of the display device using the organic device 100 according to this embodiment. FIG. 11A shows a display device such as a television monitor or a PC monitor. A display device 2700 includes a frame 2701 and a display unit 2702. The above-described organic device 100 in which the light emitting layer of the organic layer 4 contains the organic light emitting material is applicable to the display unit 2702. The display device 2700 may also include a base 2703 that supports the frame 2701 and the display unit 2702. The base 2703 is not limited to the form shown in FIG. 11A. For example, the lower side of the frame 2701 may also function as the base 2703. In addition, the frame 2701 and the display unit 2702 can be bent. The radius of curvature in this case can be 5,000 (inclusive) to 6,000 (inclusive) mm.

FIG. 11B is a schematic view showing another example of the display device using the organic device 100 according to this embodiment. A display device 2710 shown in FIG. 11B can be folded, that is, the display device 2710 is a so-called foldable display device. The display device 2710 includes a first display unit 2711, a second display unit 2712, a housing 2713, and a bending point 2714. The above-described organic device 100 in which the light emitting layer of the organic layer 4 contains the organic light emitting material is applicable to each of the first display unit 2711 and the second display unit 2712. The first display unit 2711 and the second display unit 2712 can also be one seamless display device. The first display unit 2711 and the second display unit 2712 can be divided by the bending point. The first display unit 2711 and the second display unit 2712 can display different images, and can also display one image together.

Figure 12:
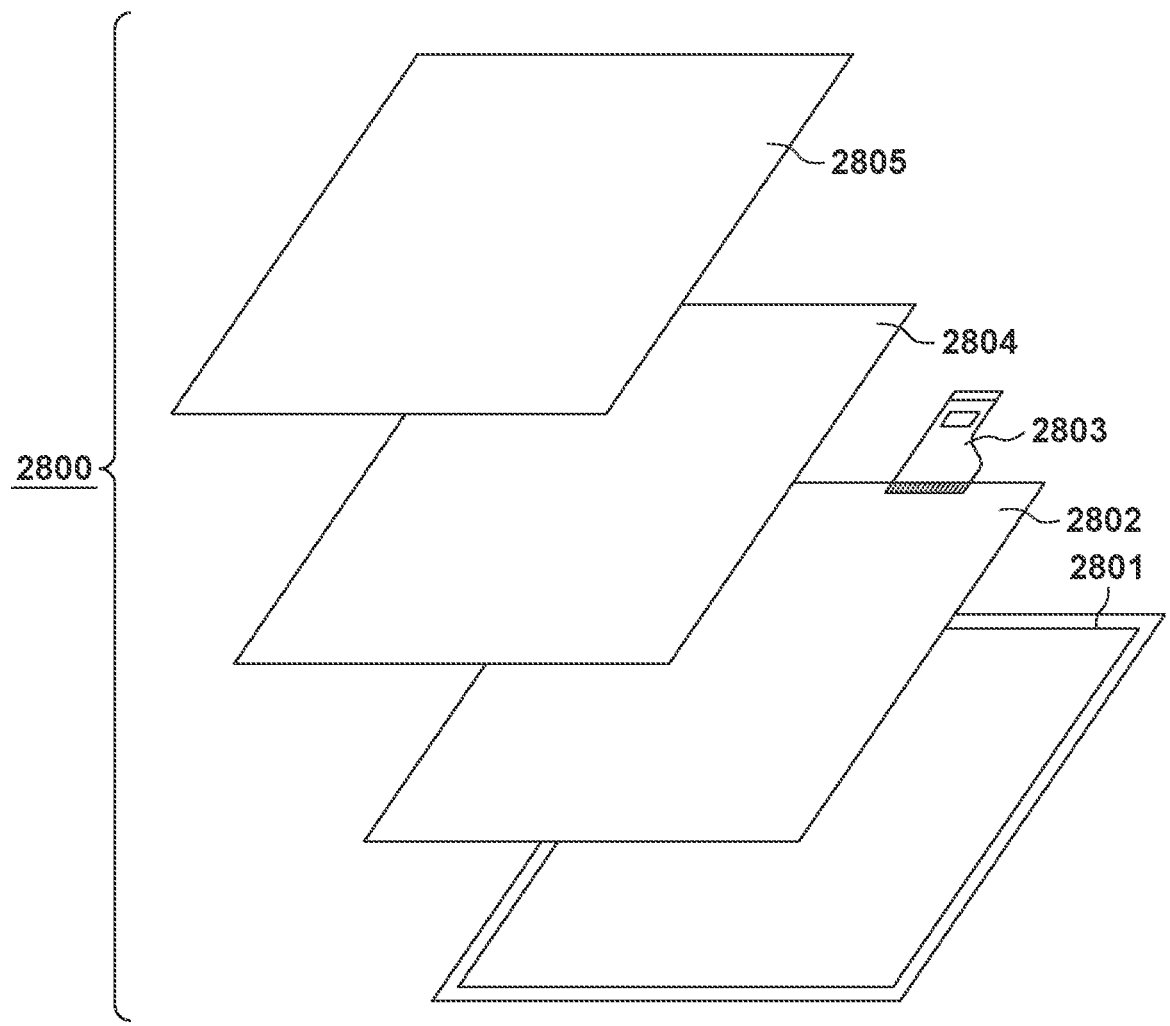
FIG. 12 is a view showing an example of an illumination device using the light emitting device according to the embodiment.

FIG. 12 is a schematic view showing an example of the illumination device using the organic device 100 according to this embodiment. An illumination device 2800 can include a housing 2801, a light source 2802, a circuit board 2803, an optical film 2804, and a light diffusing unit 2805. The above-described organic device 100 in which the light emitting layer of the organic layer 4 contains the organic light emitting material is applicable to the light source 2802. The optical film 2804 can be a filter that improves the color rendering of the light source. When performing lighting-up or the like, the light diffusing unit 2805 can throw the light of the light source over a broad range by effectively diffusing the light. The illumination device 2800 can also include a cover on the outermost portion, as needed. The illumination device 2800 can include both the optical film 2804 and the light diffusing unit 2805, and can also include only one of them.

The illumination device 2800 is a device for illuminating the room or the like. The illumination device 2800 can emit white light, natural white light, or light of any color from blue to red. The illumination device 2800 can also include a light control circuit for controlling these light components. The illumination device 2800 can also include a power supply circuit to be connected to the organic device 100 that functions as the light source 2802. This power supply circuit can be a circuit for converting an AC voltage into a DC voltage. "White" has a color temperature of 4,200 K, and "natural white" has a color temperature of 5,000 K. The illumination device 2800 may also have a color filter. In addition, the illumination device 2800 can have a heat radiation unit. The heat radiation unit radiates the internal heat of the device to the outside of the device, and examples are a metal having a high specific heat and liquid silicon.

Figure 13:
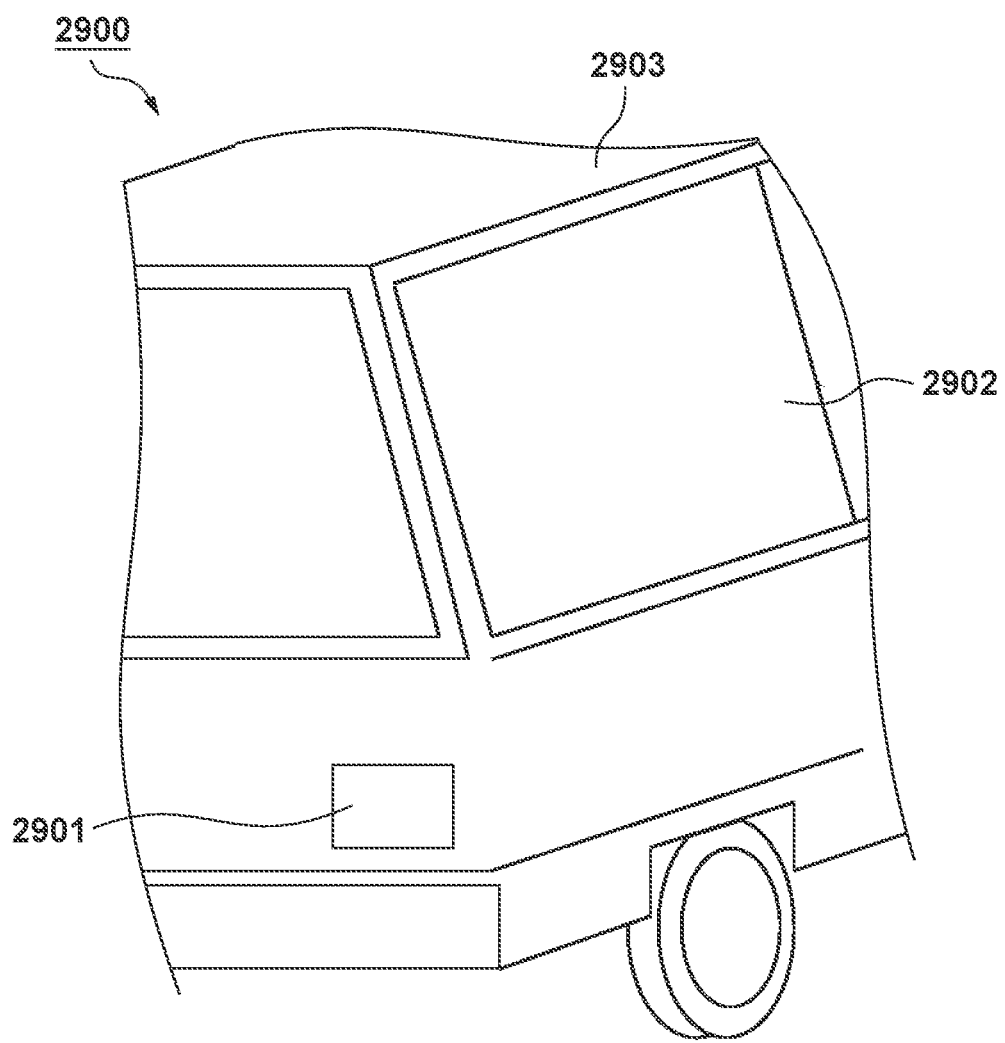
FIG. 13 is a view showing an example of a mobile device using the light emitting device according to the embodiment.

FIG. 13 is a schematic view of an automobile including a taillight as an example of a vehicle lighting appliance using the organic device 100 according to this embodiment. An automobile 2900 has a taillight 2901, and the taillight 2901 may be turned on when performing a braking operation or the like. The organic device 100 according to this embodiment may be used as a headlight serving as a vehicle lighting appliance. The automobile is an example of a mobile device, and the mobile device may be a ship, a drone, an airplane, a railway vehicle, or the like. The mobile device can include a main body and a mobile device lighting appliance installed in the main body. The lighting appliance may also be a device that sends a notification of the current position of the main body.

The above-described organic device 100 in which the light emitting layer of the organic layer 4 contains the organic light emitting material is applicable to the taillight 2901. The taillight 2901 can have a protection member for protecting the organic device 100 that functions as the taillight 2901. The material of the protection member is not limited as long as the material is a transparent material with a strength that is high to some extent, and can be polycarbonate. The protection member can also be formed by mixing a furandicarboxylic acid derivative or an acrylonitrile derivative in polycarbonate.

The automobile 2900 can include a body 2903, and a window 2902 attached to the body 2903. This window can be a window for checking the front and back of the automobile, and can also be a transparent display. The above-described organic device 100 in which the light emitting layer of the organic layer 4 contains the organic light emitting material can be used as this transparent display. In this case, the constituent materials such as the electrodes of the organic device 100 are formed by transparent members.

According to the present invention, a technique advantageous in suppressing the cost of manufacturing an organic device and in suppressing a leak current can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-119448, filed Jul. 10, 2020, which is hereby incorporated by reference herein in its entirety.

What is claimed is:

1. An organic device comprising a substrate, a first conductive line and a second conductive line arranged above a main surface of the substrate, an interlayer insulating layer arranged above the first conductive line and the second conductive line, a first electrode arranged above the interlayer insulating layer, an organic layer arranged above the first electrode, and a second electrode arranged above the organic layer,
wherein:
in a region, of the interlayer insulating layer, where the organic layer is arranged in an orthogonal projection with respect to the main surface, there are arranged a first via hole, in which a first conductive member configured to electrically connect the first conductive line and the first electrode is arranged, and a second via hole, in which a second conductive member configured to electrically connect the second conductive line and the second electrode is arranged;
at least an upper portion of the first via hole is filled with the first conductive member;
at least an upper portion of the second via hole includes a region which is not filled with the second conductive member;
a side surface of the second via hole is covered by the second conductive member in the region which is not filled with the second conductive member in the second via hole;
an inner wall, of the second conductive member, along the side surface of the second via hole includes a region without the organic layer; and
the second electrode is in contact with the region without the organic layer in the inner wall, of the second conductive member, along the side surface of the second via hole.

2. The organic device according to claim 1, wherein the first via hole is entirely filled with the first conductive member.

3. The organic device according to claim 1, wherein in an orthogonal projection with respect to the main surface, an area of an upper end of the first via hole is smaller than an area of an upper end of the second via hole.

4. The organic device according to claim 1, wherein in an orthogonal projection with respect to the main surface, a length between portions that face each other of a side surface of the first via hole is shorter than a length between portions that face each other of the side surface of the second via hole.

5. The organic device according to claim 1, wherein in an orthogonal projection with respect to the main surface, a length between portions that face each other of an upper end of a side surface of the first via hole is shorter than a length between portions that face each other of an upper end of the side surface of the second via hole.

6. The organic device according to claim 1, wherein in an orthogonal projection with respect to the main surface, a length between portions that face each other of an upper end of the inner wall, of the second conductive member, along the side surface of the second via hole is longer than twice a thickness of the organic layer.

7. The organic device according to claim 1, wherein the organic layer covers a portion that includes an upper end of the inner wall, of the second conductive member, along the side surface of the second via hole.

8. The organic device according to claim 1, wherein the inner wall, of the second conductive member, along the side surface of the second via hole includes a first slope portion, an angle of which with respect to a surface parallel to the main surface is a first angle, and a second slope portion, an angle of which with respect to a surface parallel to the main surface is a second angle smaller than the first angle, and which is arranged between the first slope portion and an upper end of the inner wall, of the second conductive member, along the side surface of the second via hole.

9. The organic device according to claim 1, further comprising:
a protective layer arranged on the second electrode,
wherein the protective layer is in contact with the inner wall, of the second conductive member, along the side surface of the second via hole.

10. The organic device according to claim 1, wherein the inner wall, of the second conductive member, along the side surface of the second via hole contains titanium.

11. The organic device according to claim 1, wherein the second conductive member has a multilayered structure that includes a first member configured to contact the side surface of the second via hole and a second member configured to form the inner wall, of the second conductive member, along the side surface of the second via hole,
wherein the first member contains the same material as the first conductive member, and
wherein the second member contains the same material as the first electrode.

12. The organic device according to claim 1, wherein the organic layer includes a light emitting layer or a photoelectric conversion layer.

13. A display device comprising:
the organic device according to claim 1; and
an active element connected to the organic device.

14. A photoelectric conversion device comprising:
an optical unit that includes a plurality of lenses;
an image capturing element configured to receive light that passed through the optical unit; and
a display unit configured to display an image captured by the image capturing element and includes the organic device according to claim 1.

15. An electronic device comprising:
a housing in which a display unit is arranged; and
a communication unit configured to communicate with an external device,
wherein the display unit includes the organic device according to claim 1.

16. An illumination device comprising:
a light source; and
at least one of a light diffusing unit and an optical film,
wherein the light source includes the organic device according to claim 1.

17. A mobile device lighting appliance comprising:
the organic device according to claim 1; and
a protective member configured to protect the organic device.

18. A mobile device comprising:
a body; and
a lighting appliance arranged on the body,
wherein the light appliance includes the organic device according to claim claim 1.

* * * * *